United States Patent
DeKeuster et al.

(10) Patent No.: US 12,230,829 B2
(45) Date of Patent: Feb. 18, 2025

(54) MOUNTING CLIP FOR PRINTED CIRCUIT BOARD

(71) Applicant: CPS Technology Holdings LLC, New York, NY (US)

(72) Inventors: Richard M. DeKeuster, Racine, WI (US); Judson W. Riggins, Milwaukee, WI (US); Abed Al Fattah Isam Shafie, Shorewood, WI (US); Nicholas E. Elison, Milwaukee, WI (US)

(73) Assignee: CPS Technology Holdings LLC, New York, NY (US)

( * ) Notice: Subject to any disclaimer, the term of this patent is extended or adjusted under 35 U.S.C. 154(b) by 661 days.

(21) Appl. No.: 17/280,340

(22) PCT Filed: Sep. 27, 2019

(86) PCT No.: PCT/US2019/053607
§ 371 (c)(1),
(2) Date: Mar. 26, 2021

(87) PCT Pub. No.: WO2020/069410
PCT Pub. Date: Apr. 2, 2020

(65) Prior Publication Data
US 2022/0037734 A1 Feb. 3, 2022

Related U.S. Application Data

(60) Provisional application No. 62/737,188, filed on Sep. 27, 2018.

(51) Int. Cl.
*H01M 50/284* (2021.01)
*H01M 10/42* (2006.01)
(Continued)

(52) U.S. Cl.
CPC ....... *H01M 50/284* (2021.01); *H01M 10/425* (2013.01); *B60L 50/64* (2019.02);
(Continued)

(58) Field of Classification Search
CPC ........... H01M 2220/20; H01M 10/425; H01M 10/4257; H01M 50/209; H01M 50/271;
(Continued)

(56) References Cited

U.S. PATENT DOCUMENTS 3,066,367 A * 12/1962 Garman .................... F16B 5/06
24/336
3,845,359 A * 10/1974 Fedele ................. H05K 7/1404
361/752
(Continued)

FOREIGN PATENT DOCUMENTS

| CN | 1476114 A | 2/2004 |
|---|---|---|
| CN | 203896620 U | 10/2014 |

(Continued)

OTHER PUBLICATIONS

International Search Report and Written Opinion of the International Searching Authority dated Feb. 12, 2020 for PCT/US2019/053607 filed Sep. 27, 2019, 18 pages.

*Primary Examiner* — Imran Akram
(74) *Attorney, Agent, or Firm* — Boardman & Clark LLP

(57) ABSTRACT

A mounting clip for a battery housing is provided. The mounting clip includes a support structure including a recess extending partially into the support structure, wherein the recess is configured to receive a printed circuit board and the recess is configured to enable the printed circuit board to move within the recess to dampen loading.

10 Claims, 8 Drawing Sheets

(51) Int. Cl.
*B60L 50/64* (2019.01)
*H01M 50/209* (2021.01)
*H01M 50/213* (2021.01)
*H01M 50/227* (2021.01)
*H01M 50/249* (2021.01)
*H01M 50/271* (2021.01)

(52) U.S. Cl.
CPC ........ *H01M 50/209* (2021.01); *H01M 50/213* (2021.01); *H01M 50/227* (2021.01); *H01M 50/249* (2021.01); *H01M 50/271* (2021.01); *H01M 2220/20* (2013.01)

(58) Field of Classification Search
CPC .......... H01M 10/0413; H01M 10/0481; H05K 7/142; H05K 2201/10386; H05K 7/12; H05K 7/1417
See application file for complete search history.

(56) References Cited

U.S. PATENT DOCUMENTS

| | | | | |
|---|---|---|---|---|
| 3,996,500 A * | 12/1976 | Coules | ............ | H05K 7/12 248/500 |
| 4,405,972 A * | 9/1983 | Fiorentino | ............ | H05K 7/1404 361/801 |
| 4,896,777 A * | 1/1990 | Lewis | ............ | G11B 33/08 361/759 |
| 4,990,880 A * | 2/1991 | Albert | ............ | H01F 27/027 336/83 |
| 5,253,147 A * | 10/1993 | Kleyner | ............ | H05K 7/1418 361/752 |
| 6,413,117 B1 | 7/2002 | Annerino et al. | | |
| 6,474,480 B2 * | 11/2002 | Negishi | ............ | H05K 7/1425 361/752 |
| 6,746,254 B2 * | 6/2004 | Hooper | ............ | H05K 7/142 439/95 |
| 6,751,103 B1 | 6/2004 | Siversten | | |
| D608,190 S * | 1/2010 | Jimenez | ............ | D8/395 |
| D625,580 S * | 10/2010 | Giordano | ............ | D8/349 |
| 8,020,902 B1 * | 9/2011 | Li | ............ | G06F 1/20 292/DIG. 16 |
| 2001/0052177 A1 * | 12/2001 | Boe | ............ | H05K 7/142 29/762 |
| 2003/0031004 A1 * | 2/2003 | Hooper | ............ | H05K 7/142 361/801 |
| 2004/0259396 A1 * | 12/2004 | Mueller | ............ | H04Q 1/116 439/95 |
| 2005/0081224 A1 * | 4/2005 | Hsu | ............ | G11B 33/121 |
| 2007/0050955 A1 * | 3/2007 | Hansen | ............ | F16B 5/0614 24/297 |
| 2008/0151523 A1 * | 6/2008 | Chen | ............ | G11B 33/124 |
| 2008/0192448 A1 * | 8/2008 | Dittus | ............ | H05K 7/1429 361/759 |
| 2012/0223198 A1 * | 9/2012 | Grobe | ............ | G06F 1/187 248/220.21 |
| 2013/0273396 A1 | 10/2013 | Jackson | | |
| 2015/0069829 A1 | 3/2015 | Dulle | | |
| 2015/0093615 A1 * | 4/2015 | Yoshioka | ............ | H01M 50/519 429/93 |
| 2017/0117527 A1 * | 4/2017 | Bonnard | ............ | H01M 10/425 |
| 2017/0164487 A1 * | 6/2017 | Kim | ............ | G06F 1/184 |

FOREIGN PATENT DOCUMENTS

| | | |
|---|---|---|
| CN | 205985128 U | 2/2017 |
| CN | 107068954 A | 8/2017 |
| GB | 201706794 | 6/2017 |
| JP | H0887992 A | 4/1996 |
| WO | 2015016978 A1 | 2/2015 |

* cited by examiner

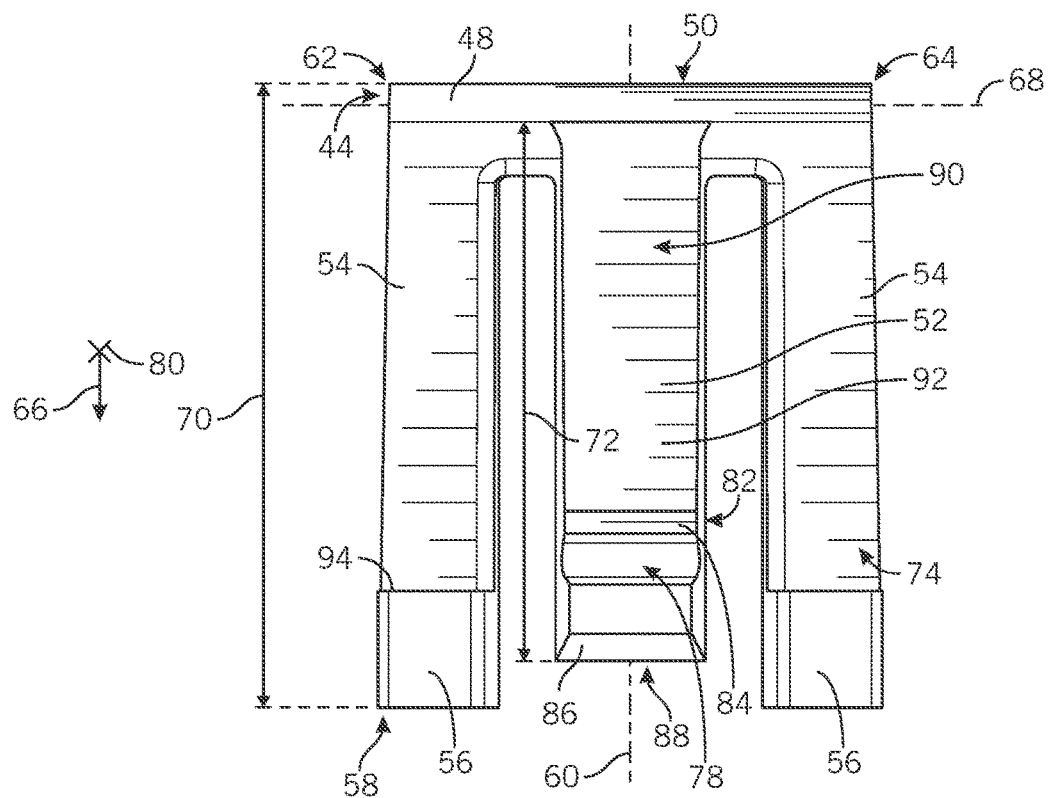
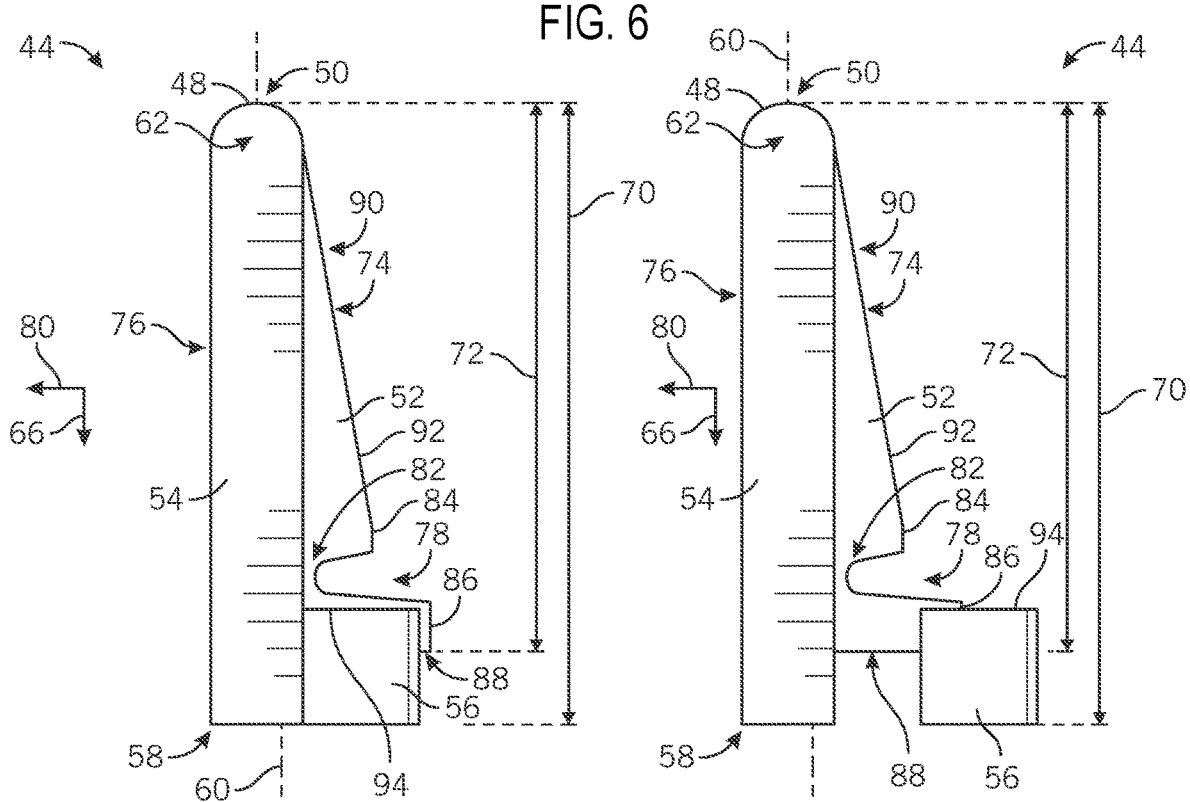
FIG. 6
FIG. 7
FIG. 8

MOUNTING CLIP FOR PRINTED CIRCUIT BOARD

CROSS-REFERENCE TO RELATED APPLICATIONS

This application is a 371 national phase entry of International Application No. PCT/US2019/053607, filed Sep. 27, 2019, which claims priority to and the benefit of U.S. Provisional Patent Application Ser. No. 62/737,188 filed Sep. 27, 2018, entitled MOUNTING CLIP FOR PRINTED CIRCUIT BOARD, the entire contents of each of which is incorporated by reference herein in its entirety.

FIELD

The present disclosure relates generally to the field of batteries and battery modules. More specifically, the present disclosure relates to a mounting clip for mounting a printed circuit board within a battery housing.

BACKGROUND

The present disclosure relates generally to the field of batteries and battery modules. More specifically, the present disclosure relates to a mounting clip for mounting a printed circuit board within a battery housing.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as 48 Volt (V) or 130V systems. The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine. Mild hybrids are typically 96V to 130V and recover braking energy through a belt or crank integrated starter generator. Further, a micro-hybrid electric vehicle (mHEV) also uses a "Stop-Start" system similar to the mild hybrids, but the micro-hybrid systems of a mHEV may or may not supply power assist to the internal combustion engine and operates at a voltage below 60V. For the purposes of the present discussion, it should be noted that mHEVs typically do not technically use electric power provided directly to the crankshaft or transmission for any portion of the motive force of the vehicle, but an mHEV may still be considered as an xEV since it does use electric power to supplement a vehicle's power needs when the vehicle is idling with internal combustion engine disabled and recovers braking energy through an integrated starter generator. In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12V systems powered by a lead acid battery. For example, xEVs may produce fewer undesirable emission products and may exhibit greater fuel efficiency as compared to traditional internal combustion vehicles and, in some cases, such xEVs may eliminate the use of gasoline entirely, as is the case of certain types of EVs or PEVs.

As technology continues to evolve, there is a need to provide improved power sources, particularly battery modules, for such vehicles. For example, in traditional configurations, a printed circuit board (PCB) is mounted on the battery module, receives signals from the sensors indicative of the operating conditions, and processes the signals to determine information relating to the operating conditions. However, securing the PCB to the battery housing requires additional manufacturing equipment and steps that increase the cost of the battery module. In addition, utilizing the additional components to secure the PCB makes the PCB assembly more vulnerable to tolerance stack ups. Further, present techniques to secure the PCB limit the space usage on the PCB and the configurations of components (e.g., trace configurations) on the PCB. Accordingly, it is now recognized that improved retention of the PCB to the battery module is desired.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present embodiments are directed to, among other things, a mounting clip for a battery housing. The mounting clip may include a support structure including a recess extending partially into the support structure, wherein the recess is configured to receive a printed circuit board and the recess is configured to enable the printed circuit board to move within the recess to dampen loading.

Present embodiments are also directed to a mounting clip for a battery housing. The mounting clip may include a cross member at a top of the mounting clip. The mounting clip also may include a pair of flanking support members, wherein each flanking support member extends from a respective longitudinal end of the cross member in a direction opposite a longitudinal axis of the cross member. The mounting clip further may include a structure coupled to and suspending from the cross member between the pair of flanking support members, wherein the structure includes a recess extending partially into the structure, wherein the recess is configured to receive a printed circuit board and the recess is configured to enable the printed circuit board to move within the recess to dampen loading.

Present embodiments are further directed to a battery module. The battery module may include a support member. The battery module also may include multiple mounting clips disposed on the support member, wherein the multiple mounting clips are configured to couple a printed circuit board within a battery housing of the battery module. Each mounting clip of the multiple mounting clips may include a cross member at a top of the mounting clip. Each mounting clip also may include a pair of flanking support members, wherein each flanking support member extends from a respective longitudinal end of the cross member in a direction opposite a longitudinal length of the cross member. Each mounting clip further may include a structure coupled to and suspending from the cross member between the pair of flanking support members, wherein the structure includes a recess extending partially into the structure, wherein the recess is configured to receive the printed circuit board and the recess is configured to enable the printed circuit board to move within the recess to dampen loading.

The disclosed mounting clip and PCB may have various advantages, including improved retention of the PCB in a battery module. These and other advantages may be understood by the description provided herein.

DRAWINGS

FIG. 6 is a front elevation view of the mounting clip of FIG. 4;

FIG. 7 is a side elevation view of the mounting clip of FIG. 4;

FIG. 8 is another side elevation view of the mounting clip of FIG. 4 with foot members spaced apart from the mounting clip;

Figure 1:
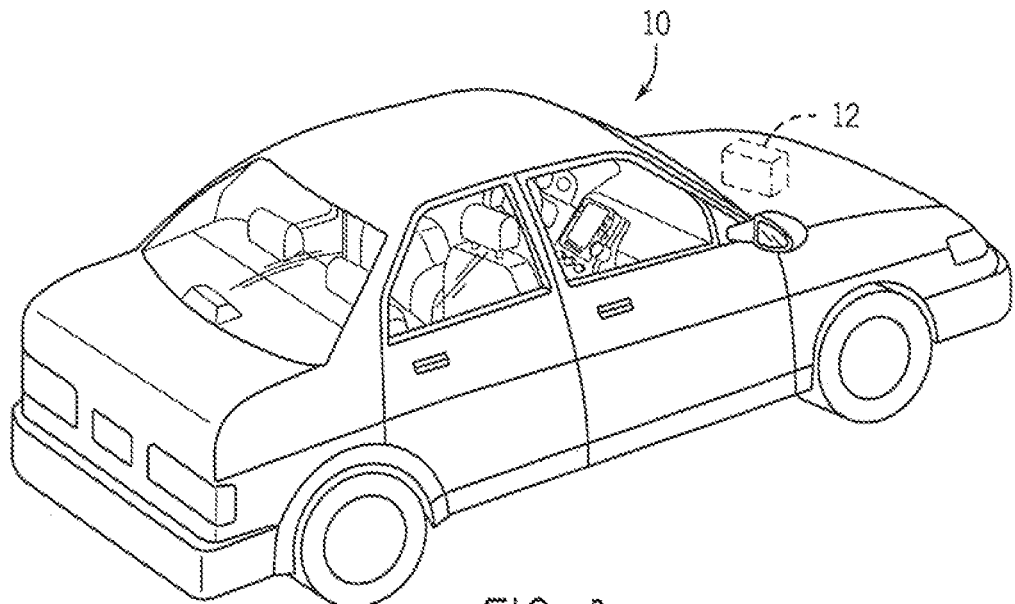
FIG. 1 is a perspective view of a vehicle having a battery system configured in accordance with various embodiments to provide power for various components of the vehicle.

It should be understood that the drawings are not necessarily to scale. In certain instances, details that are not necessary to the understanding of the invention or render other details difficult to perceive may have been omitted. It should be understood, of course, that the invention is not necessarily limited to the particular embodiments illustrated herein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The battery systems described herein may be used to provide power to various types of electric vehicles (xEVs) and other high voltage energy storage/expending applications (e.g., electrical grid power storage systems). Such battery systems may include one or more battery modules, each battery module having a number of battery cells (e.g., lithium-ion (Li-ion) electrochemical cells) arranged and electrically interconnected to provide particular voltages and/or currents useful to power, for example, one or more components of an xEV. As another example, battery modules in accordance with present embodiments may be incorporated with or provide power to stationary power systems (e.g., non-automotive systems).

In accordance with embodiments of the present disclosure, the battery module may include a support member (e.g., lid) that is disposed within a housing of the battery module that includes one or more mounting clips for securing a printed circuit board (PCB) within the battery housing. The clips are configured to be more robust to tolerance stack ups. In particular, the clips are more robust with regard to part variation (e.g., parts associated with the PCB). Each clip includes a recess that receives and holds the PCB while enabling the PCB to slightly move within the recess (e.g., during expansion of components of the PCB) to dampen loading. The recess also provides flexibility with regard to the location and/or height of the PCB relative to the housing and busbars of the battery module. The clips may reduce manufacturing equipment and steps needed to install the PCB into the housing. Avoiding additional components to secure the PCB into the housing reduces cost. In addition, the clips take up less space on the PCB, thus, maximizing the usable space on the PCB. In addition, since the clips take up less space on the PCB, it enables more direct connections between components of the PCB (e.g., traces).

To help illustrate, FIG. 1 is a perspective view of an embodiment of a vehicle 10, which may utilize a regenerative braking system. Although the following discussion is presented in relation to vehicles with regenerative braking systems, the techniques described herein are adaptable to other vehicles that capture/store electrical energy with a battery, which may include electric-powered and gas-powered vehicles.

As discussed above, it would be desirable for a battery system 12 to be largely compatible with traditional vehicle designs. Accordingly, the battery system 12 may be placed in a location in the vehicle 10 that would have housed a traditional battery system. For example, as illustrated, the vehicle 10 may include the battery system 12 positioned similarly to a lead-acid battery of a typical combustion-engine vehicle (e.g., under the hood of the vehicle 10). Furthermore, as will be described in more detail below, the battery system 12 may be positioned to facilitate managing temperature of the battery system 12. For example, in some embodiments, positioning a battery system 12 under the hood of the vehicle 10 may enable an air duct to channel airflow over the battery system 12 and cool the battery system 12.

Figure 2:
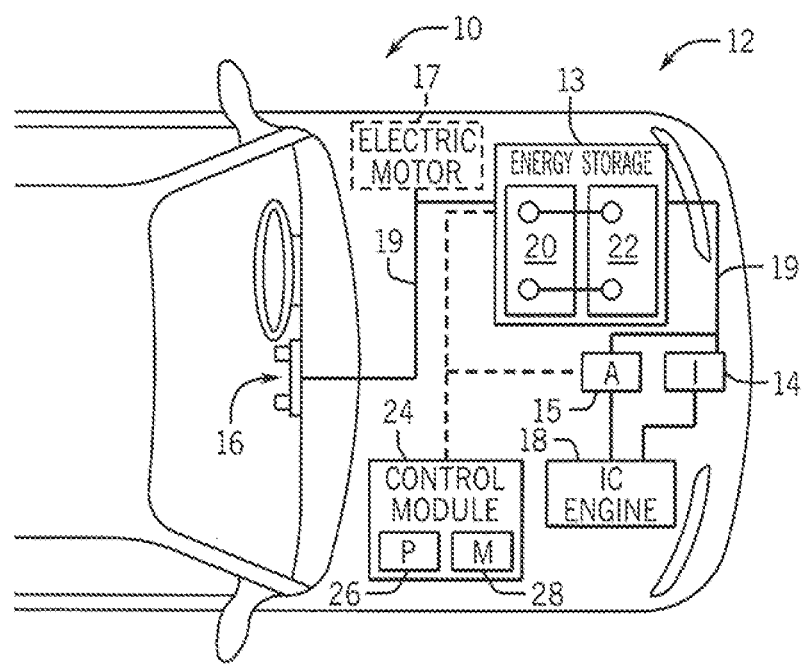
FIG. 2 is a cutaway schematic view of an embodiment of the vehicle and the battery system of FIG. 1.

A more detailed view of the battery system 12 is described in FIG. 2. As depicted, the battery system 12 includes an energy storage component 13 coupled to an ignition system 14, an alternator 15, a vehicle console 16, and optionally to an electric motor 17. Generally, the energy storage component 13 may capture/store electrical energy generated in the vehicle 10 and output electrical energy to power electrical devices in the vehicle 10.

In other words, the battery system 12 may supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. Illustratively, in the depicted embodiment, the energy storage component 13 supplies power to the vehicle console 16 and the ignition system 14, which may be used to start (e.g., crank) the internal combustion engine 18.

Additionally, the energy storage component 13 may capture electrical energy generated by the alternator 15 and/or the electric motor 17. In some embodiments, the alternator 15 may generate electrical energy while the internal combustion engine 18 is running. More specifically, the alternator 15 may convert the mechanical energy produced by the rotation of the internal combustion engine 18 into electrical energy. Additionally or alternatively, when the vehicle 10 includes an electric motor 17, the electric motor 17 may generate electrical energy by converting mechanical energy produced by the movement of the vehicle 10 (e.g., rotation of the wheels) into electrical energy. Thus, in some embodiments, the energy storage component 13 may capture electrical energy generated by the alternator 15 and/or the electric motor 17 during regenerative braking. As such, the alternator 15 and/or the electric motor 17 are generally referred to herein as a regenerative braking system.

To facilitate capturing and supplying electric energy, the energy storage component 13 may be electrically coupled to the vehicle's electric system via a bus 19. For example, the bus 19 may enable the energy storage component 13 to receive electrical energy generated by the alternator 15 and/or the electric motor 17. Additionally, the bus 19 may enable the energy storage component 13 to output electrical energy to the ignition system 14 and/or the vehicle console 16. For example, when a 12-volt battery system 12 is used, the bus 19 may carry electrical power typically as a non-limiting example between 8-18 volts.

Additionally, as depicted, the energy storage component 13 may include multiple battery modules. For example, in the depicted embodiment, the energy storage component 13 includes a lithium ion (e.g., a first) battery module 20 and a lead-acid (e.g., a second) battery module 22, which each includes one or more battery cells. In other embodiments, the energy storage component 13 may include any number of battery modules. Additionally, although the lithium ion battery module 20 and lead-acid battery module 22 are depicted adjacent to one another, they may be positioned in different areas around the vehicle. For example, the lead-acid battery module 22 may be positioned in or about the interior of the vehicle 10 while the lithium ion battery module 20 may be positioned under the hood of the vehicle 10.

In some embodiments, the energy storage component 13 may include multiple battery modules to utilize multiple different battery chemistries. For example, when the lithium ion battery module 20 is used, performance of the battery system 12 may be improved since the lithium ion battery chemistry generally has a higher coulombic efficiency and/or a higher power charge acceptance rate (e.g., higher maximum charge current or charge voltage) than the lead-acid battery chemistry. As such, the capture, storage, and/or distribution efficiency of the battery system 12 may be improved.

To facilitate controlling the capturing and storing of electrical energy, the battery system 12 may additionally include a control module 24. More specifically, the control module 24 may control operations of components in the battery system 12, such as relays (e.g., switches) within energy storage component 13, the alternator 15, and/or the electric motor 17. For example, the control module 24 may regulate amount of electrical energy captured/supplied by each battery module 20 or 22 (e.g., to de-rate and re-rate the battery system 12), perform load balancing between the battery modules 20 and 22, determine a state of charge of each battery module 20 or 22, determine temperature of each battery module 20 or 22, control voltage output by the alternator 15 and/or the electric motor 17, and the like.

Accordingly, the control unit 24 may include one or more processor 26 and one or more memory 28. More specifically, the one or more processor 26 may include one or more application specific integrated circuits (ASICs), one or more field programmable gate arrays (FPGAs), one or more general purpose processors, or any combination thereof. Additionally, the one or more memory 28 may include volatile memory, such as random access memory (RAM), and/or non-volatile memory, such as read-only memory (ROM), optical drives, hard disc drives, or solid-state drives. In some embodiments, the control unit 24 may include portions of a vehicle control unit (VCU) and/or a separate battery control module.

Figure 3:
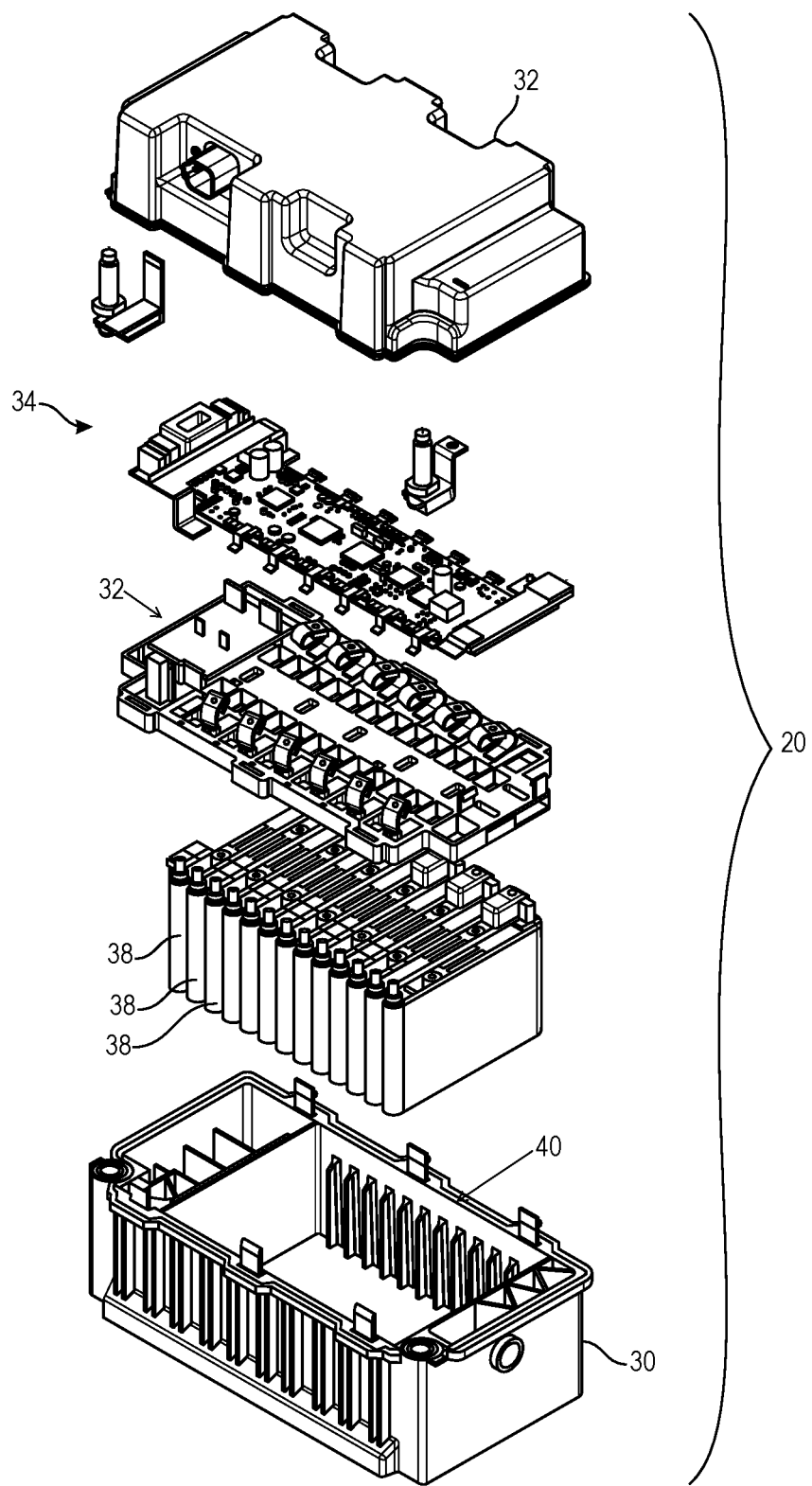
FIG. 3 is an exploded side view of a battery module for use in the vehicle of FIG. 1, in accordance with various embodiments.
Figure 4:
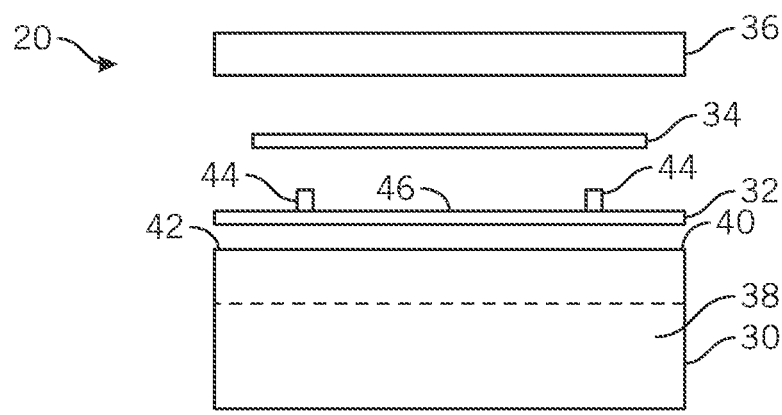
FIG. 4 is a second exploded side view of a battery module for use in the vehicle of FIG. 1, in accordance with various embodiments.

FIGS. 3 and 4 show perspectives of an exploded side view of an embodiment of the battery module 20 for use in the vehicle 10 of FIG. 1. For simplicity, not all components of the battery module 20 are illustrated (e.g., terminals, bus bars, sensors, etc.). The battery module 20 (e.g., lithium-ion (Li-ion) battery module) includes a housing 30 (e.g., plastic housing), a support member 32 (e.g., lid), a PCB 34, and a cover 36. A plurality of electrochemical cells 38 (e.g., Li-ion electrochemical cells) are disposed within the housing 30. In certain embodiments, the battery module 20 may include any number of electrochemical cells 38 (e.g., 2, 3, 4, 5, 6, 7, 8, 9, 10, or more electrochemical cells), any type of electrochemical cell 38 (e.g., Li-ion, lithium polymer, lead-acid, nickel cadmium, or nickel metal hydride, prismatic, and/or cylindrical), and any arrangement of the electrochemical cells 38 (e.g., stacked, separated, or compartmentalized).

The housing 30 includes an opening 40 on one side 42 (upper side or face) to receive the electrochemical cells 38. The support member 32 is disposed within the opening 40 above the electrochemical cells 38. The support member 32 includes one or more clips 44 (e.g., mounting clips) disposed on a side 46 of the support member 32 opposite the electrochemical cells 38. The number of clips 44 may vary (e.g., 1, 2, 3, 4, 5, 6, or more clips 44). The clips 44 may be molded as part of the support member 32. In certain embodiments, the clips 44 may be coupled or adhered to the support member 32. The clips 44 secure the PCB 34 to the support member 32 to secure the PCB 34 within the housing 30. In certain embodiments, the PCB 34 receives signals from sensors and processes the signals to provide useful information relating to the operating conditions of the battery module 20. The cover 36 is disposed over the opening 40 to enclose the components within the battery module 20.

As discussed in greater detail below, the clips 44 are configured to be more robust to tolerance stack ups. In particular, the clips 44 are more robust with regard to part variation (e.g., parts associated with the PCB). Each clip 44 includes a recess 78 that receives and holds the PCB 34 while enabling the PCB 34 to slightly move within the recess 78 (e.g., during expansion of components of the PCB 34) to dampen loading. The recess 78 also provides flexibility with regard to the location and/or height of the PCB 34 relative to the housing 30 and busbars of the battery module 20. In certain embodiments, the clips 44 include components (e.g., cross member 48) that act as a vibration dampener. In certain embodiments, displacement of the clip 44, when the PCB 34 is inserted, is spread out over multiple locations of the clip 44 (e.g., due to self-opposing features of the clip 44).

FIGS. 5-8 are different views of an embodiment of the mounting clip 44 for securing the PCB 34. The mounting clip 44 includes a cross member 48 located at a top portion 50 of the clip 44, a structure 52 (e.g., support structure), a pair of flanking support members 54, and a pair of foot members 56 (e.g., stops) located at a bottom portion 58 of the clip 44. The cross member 48 extends crosswise to a longitudinal axis 60 of the structure 52. The cross member 48 acts as a vibrational dampener. The flanking support members 54 are coupled to respective longitudinal ends 62, 64 of the cross member 48. The support members 54 extend in a vertical direction 66 (e.g., crosswise to a longitudinal axis 68 of the cross member 48) from the top portion 50 to the bottom portion 58 of the clip 44. Each flanking support member 54 has a longitudinal length 70 greater than a longitudinal length 72 of the structure 52. This enables the structure 52 to be suspended in the vertical direction 66 (e.g., crosswise to longitudinal axis 68). The flanking support members 54 flank the structure 52.

The clip 44 includes a front side 74 (e.g., that interfaces with the PCB 34) and a back side 76. The structure 52 includes a recess 78 that extends partially into structure 52 in a direction 80 from the front side 74 toward the back side 76. The recess 78 also extends parallel to the longitudinal axis 68 of the cross member 48 (as well as crosswise to the longitudinal axis 60 of the structure 52). The recess 78 is configured to receive and hold the PCB 34. The PCB 34 may vary in thickness (e.g., tolerance or functional stackup). The shape of the recess 78 may vary. As depicted, the recess 78 has a wedge shape (e.g., narrows or tapers in the direction 80). The recess 78 is configured to enable the PCB 34 to slightly move within the recess 78 (e.g., during thermal expansion of the PCB 34) to dampen loading. In addition, the recess 78 is sized to enable the PCB 34 to expand within the recess 78. A portion 82 of the structure 52 defining the recess 78 includes an upper region or portion 84 and a lower region or portion 86. The lower region 86 extends further away from the structure 52 (e.g., in a direction toward the PCB 34) than the upper region 84. The surface defining the upper portion of the recess 78 is acutely angled relative to the surface defining the lower portion of the recess 78 to keep the PCB 34 from slipping out of the recess during vibrations or shock.

As depicted, the recess 78 is located in a lower portion 88 of the structure 52 (e.g., adjacent the bottom portion 58 of the clip 44). The structure 52 includes an upper portion 90 located above the recess 78. The upper portion 90 tapers or narrows from adjacent the recess 78 to the cross member 48 (e.g., adjacent the top portion 50 of the clip 44). The upper portion 90 includes an inclined face 92 located on the front side 74 of the clip 44 (e.g., the same side as the recess 78). The inclined face 92 is angled at an acute angle relative to the longitudinal axis 60 of the structure 52. The angle of the inclined face 92 may vary (e.g., approximately 5, 10, 15, 20, 25 degrees, or any other acute angle). The inclined face 92 enables the clip 44 to receive PCB 34 in the vertical direction 66.

The upper portion 90 (along with the rest of the structure 52) is configured to flex (e.g., deflect) in the direction 66 to enable the PCB 34 to be moved from above the clip 44 into the recess 78. In addition, the flanking support members 54 are also configured to flex or deflect. Thus, the self-opposing arrangement of the clip 44 enables displacement of the clip 44 (with the PCB 34 in place) to occur to be distributed across multiple areas (e.g., the flanking support members 54 and the structure 52).

Figure 5:
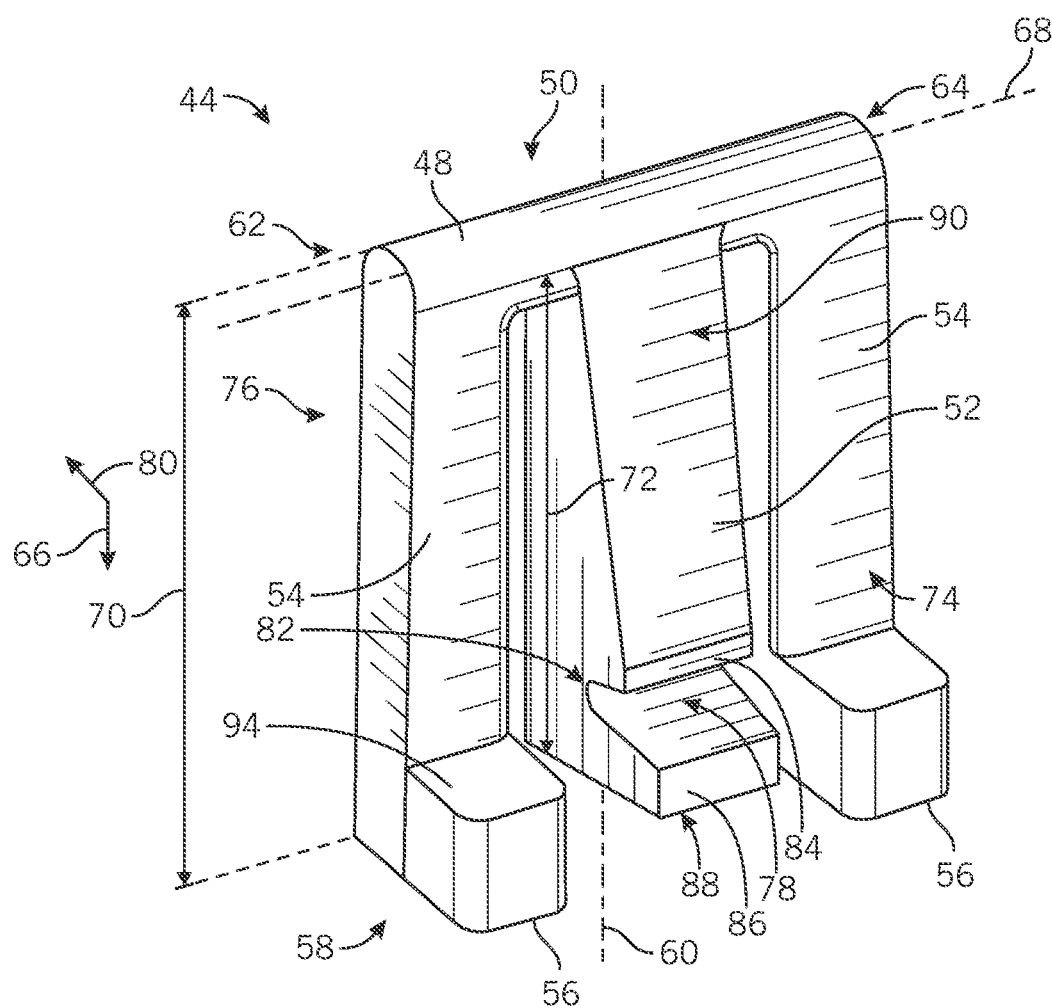
FIG. 5 is a front overhead perspective view of a mounting clip for securing a printed circuit board, in accordance with various embodiments.

As depicted in FIGS. 5-7, a respective foot member 56 (e.g., stop) is disposed adjacent to and contacts a respective flanking support member 54 at the bottom portion 58 of the clip 44. Each foot member 56 includes a top surface 94 located beneath the recess 78. The foot members 56 are configured to keep the PCB 34 from being pressed too far into the mounting clip in the direction 66. In other words, the PCB 34 cannot be pressed in the direction 66 past the foot members 56. In certain embodiments, the foot members 56 are disposed adjacent to but spaced apart from the flanking support members 54 as depicted in FIG. 8.

The configuration of the clip 44 may be robust to material choice. In certain embodiments, the clip 44 may be made of plastic. For example, the clip 44 may be made of unfilled polypropylene or glass filled polypropylene.

Figure 9A:
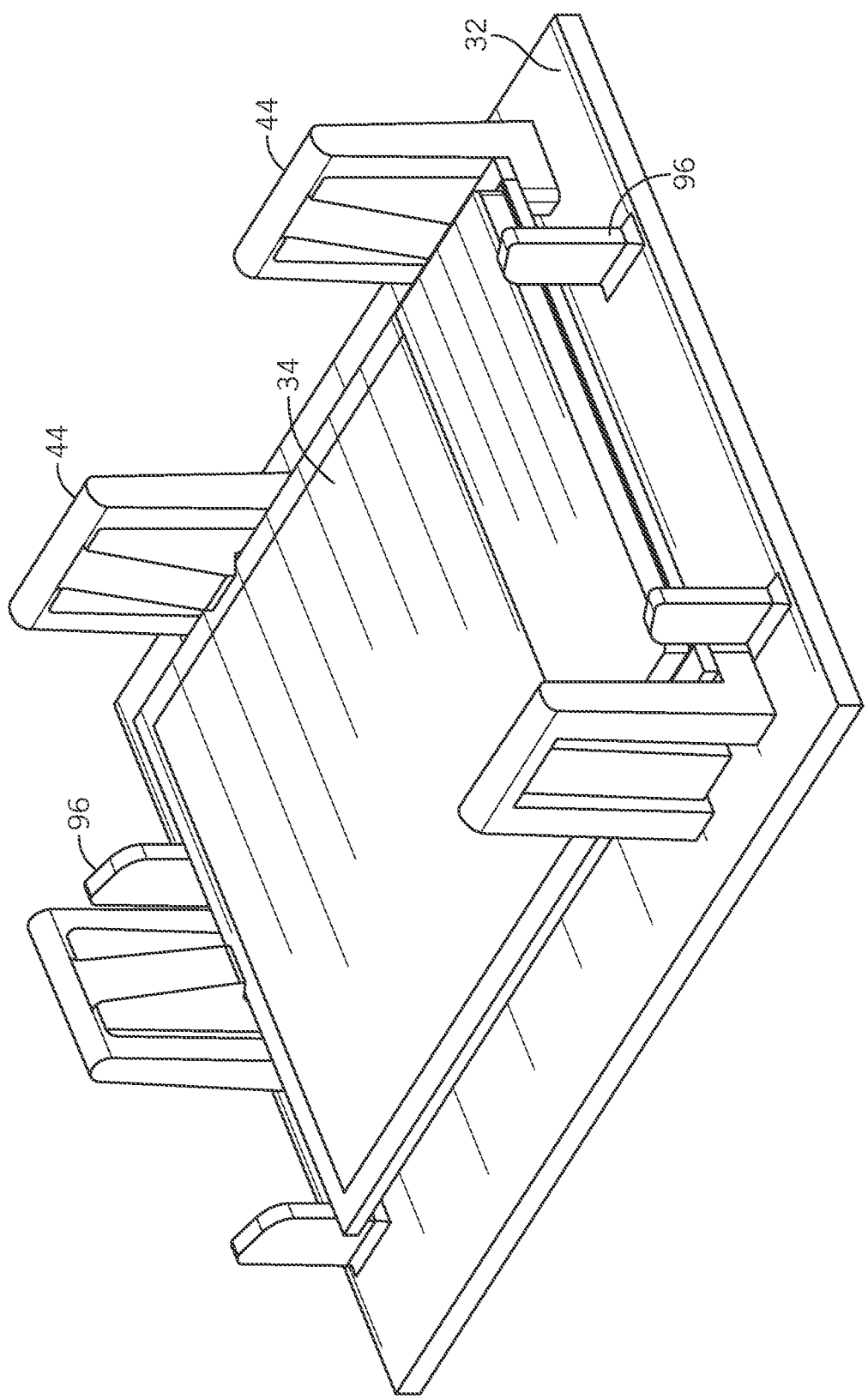
FIG. 9A is an overhead perspective view of a battery housing having a plurality of the mounting clips of FIG. 4 coupled to a printed circuit board, in accordance with various embodiments.
Figure 9B:
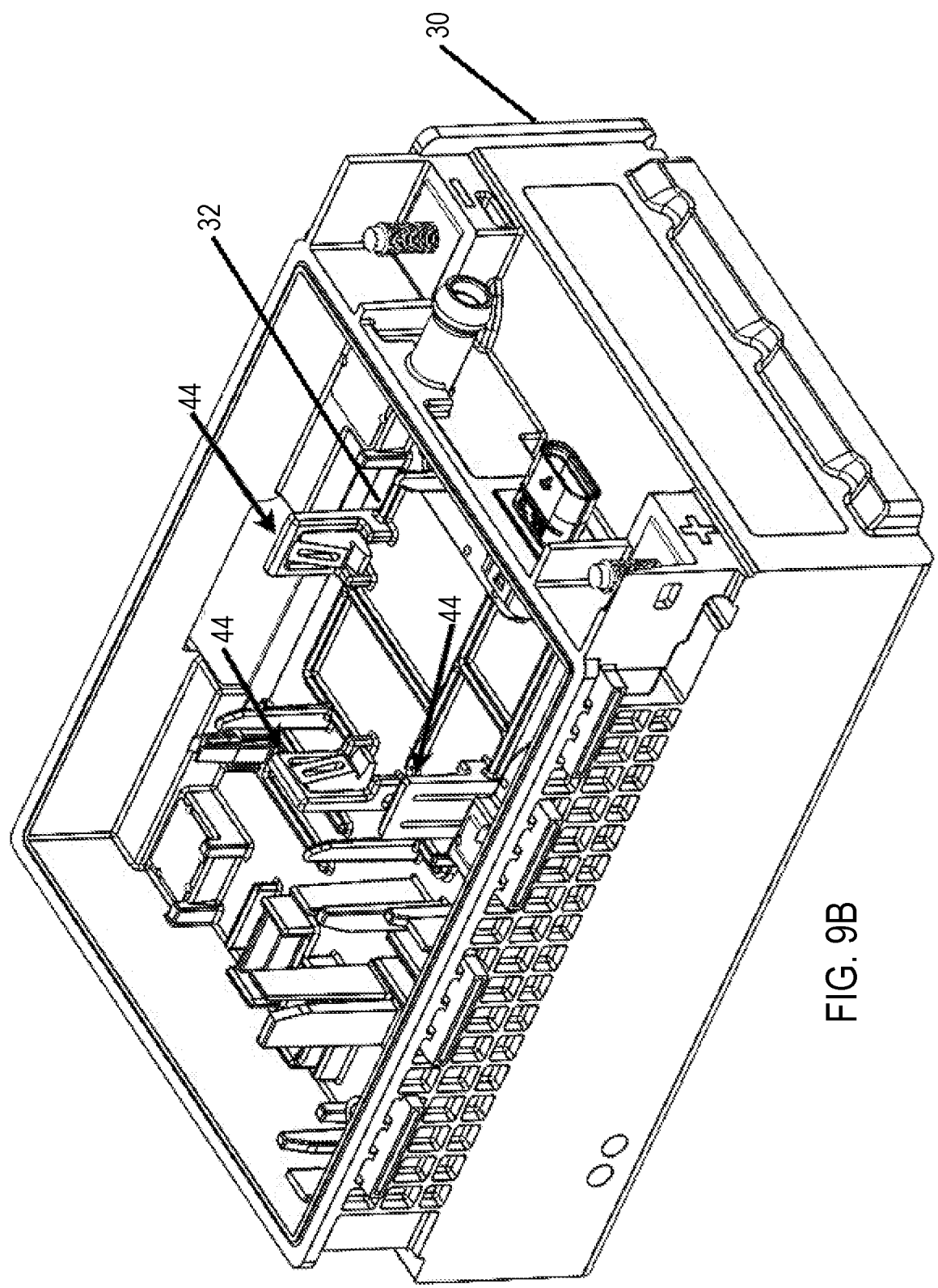
FIG. 9B is a cut away perspective view showing a plurality of the mounting clips of FIG. 4 coupled to a printed circuit board provided in a battery, in accordance with various embodiments.

FIGS. 9A and 9B are overhead perspective views of various embodiments of a plurality of the mounting clips 44 of FIG. 4 coupled to the PCB 34. As noted above, the clips 44 may be molded as part of the support member 32 (e.g. lid) or coupled (e.g., adhered or fastened) to the support member 32. As depicted, four clips 44 couple the PCB 34 to the support member 32. As noted above, the number of clips 44 to secure the PCB 34 may vary. As depicted, the clips 44 may be spaced apart. In certain embodiments, the clips 44 may be located adjacent each other. In certain embodiments, protrusions 96 (e.g., guides) may extend (e.g., vertically) from the support member 32 to act as guides during the coupling of the PCB 34 to the clips 44.

FIGS. 10-13 are different views of an embodiment of the mounting clip 44 (e.g., having C-shaped region defining recess) for securing the PCB 34. In certain embodiments, the clip 44 may be made of plastic. For example, the clip 44 may be made of a glass filled polypropylene (for example, but not limited to, 30 percent glass filled). The mounting clip 44 includes a structure 98 (for example, but not limited to, support structure) having a top portion 100 and a bottom portion 102. The clip 44 includes a front side 104 (for example, which may interface with the PCB 34) and a back side 106. The structure 52 includes a recess 108 that extends partially into structure 98 in a direction 110 from the front side 104 toward the back side 106. The recess 108 also extends crosswise to a longitudinal axis 112 of the structure 98. The recess 108 is configured to receive and hold the PCB 34. The shape of the recess 108 may vary. As depicted, the recess 108 slightly narrows or tapers in the direction 110. The recess 108 is configured to enable the PCB 34 to slightly move within the recess 108 (e.g., during expansion of the PCB 34) to dampen loading. In addition, the recess 108 is sized to enable the PCB 34 to expand within the recess 108. A portion 114 of the structure 98 defining the recess 108 includes an upper region or portion 116 and a lower region or portion 118. The lower region 116 extends further away from the structure 98 (e.g., in a direction toward the PCB 34) than the upper region 116.

As depicted, the recess 108 is located centrally between the top portion 100 and the bottom portion 102 of the clip 44. The structure 98 includes an upper portion 120 located above the recess 108. The upper portion 120 tapers or narrows from adjacent the recess 108 to the top portion 100 of the clip 44. The upper portion 120 includes an inclined face 122 located on the front side 104 of the clip 44 (e.g., the same side as the recess 108). The inclined face 122 is angled at an acute angle relative to the longitudinal axis 112 of the structure 98. The angle of the inclined face 122 may vary (e.g., approximately 5, 10, 15, 20, 25 degrees, or any other acute angle). The inclined face 122 enables the clip 44 to receive PCB 34 in the vertical direction 124. The upper portion 120 is configured to flex (e.g., deflect) in the direction 110 to enable the PCB 34 to be moved from above the clip 44 into the recess 108.

Figure 10:
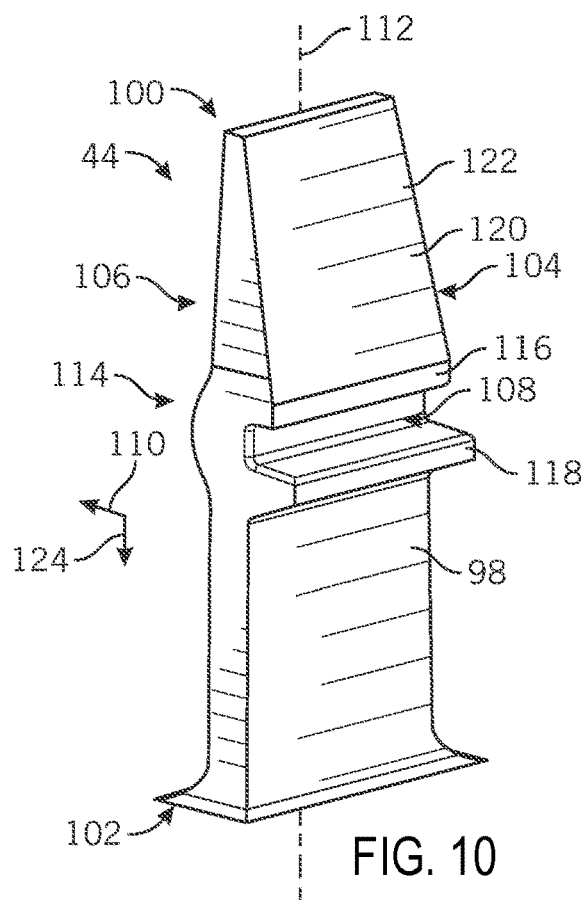
FIG. 10 is a front perspective view of an embodiment of a mounting clip (e.g., having C-shaped region defining recess) for securing a printed circuit board, in accordance with various embodiments.
Figure 11:
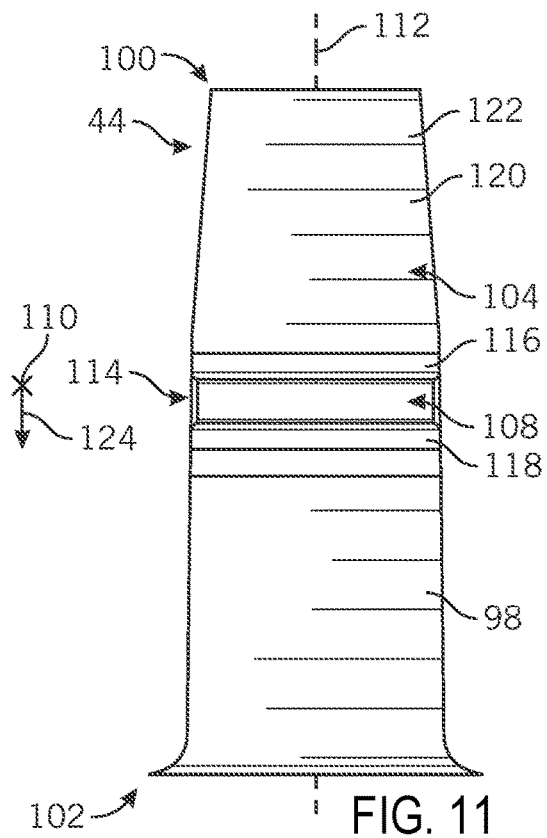
FIG. 11 is a front elevation view of the mounting clip of FIG. 10.
Figure 12:
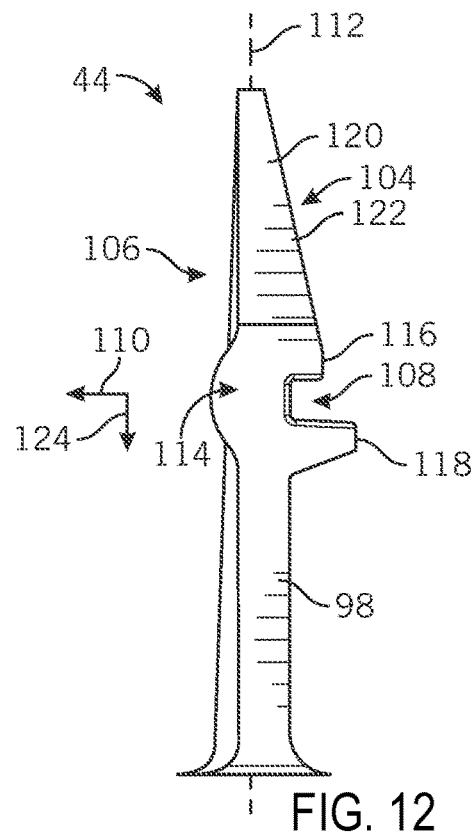
FIG. 12 is a side elevation view of the mounting clip of FIG. 10.
Figure 13:
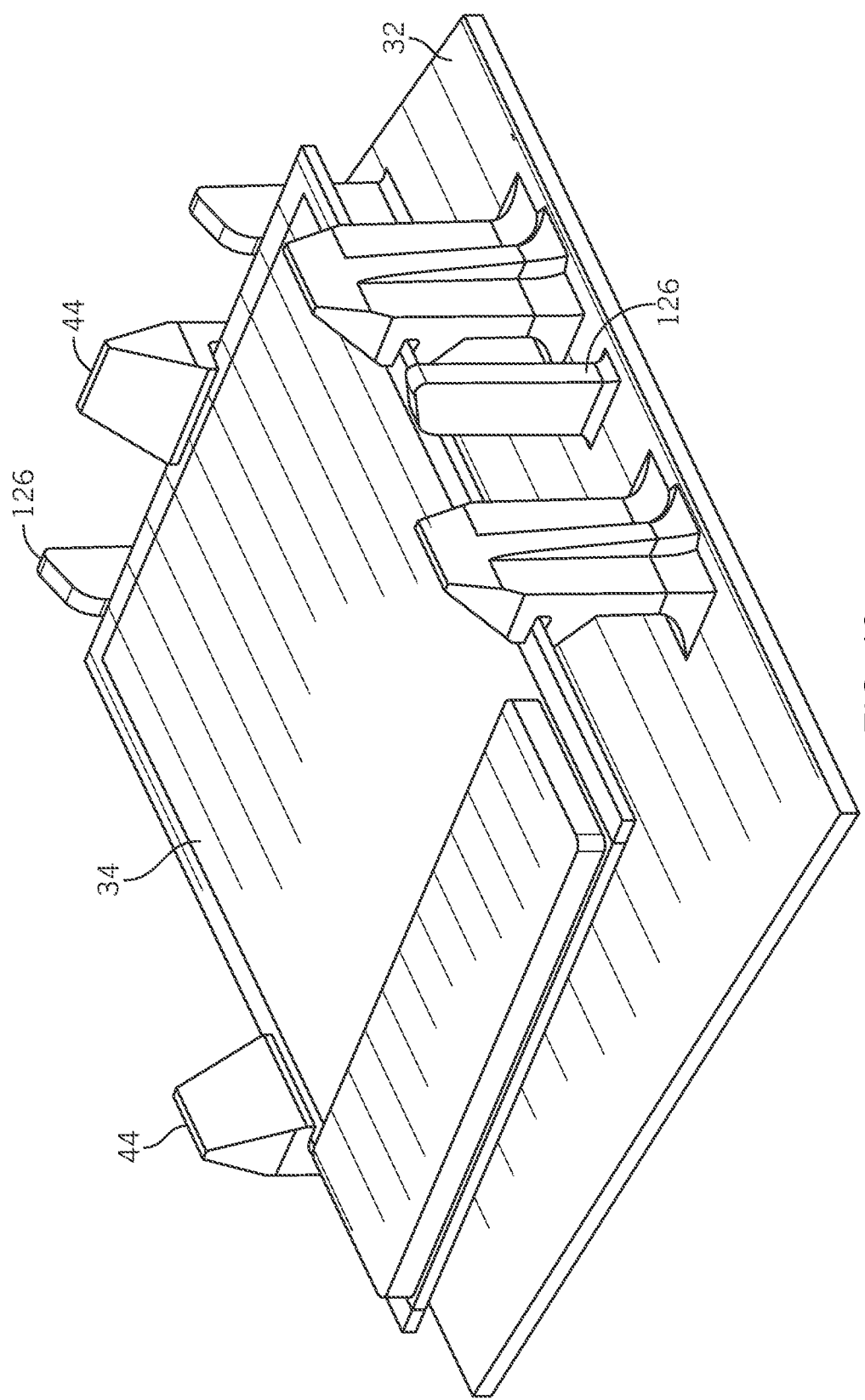
FIG. 13 is a cut away perspective view showing a plurality of the mounting clips of FIG. 10 coupled to a printed circuit board provided in a battery, in accordance with various embodiments.

FIG. 13 is an overhead perspective view of an embodiment of a plurality of the mounting clips 44 of FIG. 10 coupled to the PCB 34. As noted above, the clips 44 may be molded as part of the support member 32 (e.g. lid) or coupled (e.g., adhered or fastened) to the support member 32. As depicted, four clips 44 are coupling the PCB 34 to the support member 32. As noted above, the number of clips 44 to secure the PCB 34 may vary. As depicted, the clips 44 may be spaced apart. In certain embodiments, the clips 44 may be located adjacent each other. In certain embodiments, protrusions 126 (e.g., guides) may extend (e.g., vertically) from the support member 32 to act as guides during the coupling of the PCB 34 to the clips 44.

While only certain features and embodiments of the invention have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the exemplary embodiments, all features of an actual implementation may not have been described (i.e., those unrelated to the presently contemplated best mode of carrying out the invention, or those unrelated to enabling the claimed invention). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

While specific examples are shown, one of skill in the art will recognize that these are examples only and variations thereon may be made without departing from the overall scope of the present invention.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that references to relative positions (e.g., "top" and "bottom") in this description are merely used to identify various elements as are oriented in the Figures. It should be recognized that the orientation of particular components may vary greatly depending on the application in which they are used.

For the purpose of this disclosure, the term "coupled" means the joining of two members directly or indirectly to one another. Such joining may be stationary in nature or moveable in nature. Such joining may be achieved with the two members or the two members and any additional intermediate members being integrally formed as a single unitary body with one another or with the two members or the two members and any additional intermediate members being attached to one another. Such joining may be permanent in nature or may be removable or releasable in nature.

It is also important to note that the construction and arrangement of the system, methods, and devices as shown in the various examples of embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements show as multiple parts may be integrally formed, the operation of the interfaces may be reversed or otherwise varied, the length or width of the structures and/or members or connector or other elements of the system may be varied, the nature or number of adjustment positions provided between the elements may be varied (e.g. by variations in the number of engagement slots or size of the engagement slots or type of engagement). The order or sequence of any process or method steps may be varied or re-sequenced according to alternative embodiments. Other substitutions, modifications, changes and omissions may be made in the design, operating conditions and arrangement of the various examples of embodiments without departing from the spirit or scope of the present inventions.

While this invention has been described in conjunction with the examples of embodiments outlined above, various alternatives, modifications, variations, improvements and/or substantial equivalents, whether known or that are or may be presently foreseen, may become apparent to those having at least ordinary skill in the art. Accordingly, the examples of embodiments of the invention, as set forth above, are intended to be illustrative, not limiting. Various changes may be made without departing from the spirit or scope of the invention. Therefore, the invention is intended to embrace all known or earlier developed alternatives, modifications, variations, improvements and/or substantial equivalents.

The technical effects and technical problems in the specification are exemplary and are not limiting. It should be noted that the embodiments described in the specification may have other technical effects and can solve other technical problems.

The invention claimed is:

1. A mounting clip for a battery housing, comprising:
   a support structure comprising a unitary body having a longitudinal axis, a base portion, and an upper portion opposite the base portion;
   a recess extending partially into the support structure at a location along the support structure between the base portion and the upper portion, the recess configured to receive a printed circuit board and the recess configured to enable the printed circuit board to move within the recess to dampen loading;
   a portion of the support structure defining the recess includes an upper region and a lower region, the lower region extending further away from the support structure than the upper region, and the portion comprising a C-shaped cross section relative to the longitudinal axis of the support structure;
   a cross member coupled to the support structure, the cross member extending crosswise to the longitudinal axis of the support structure, and the support structure suspends from the cross member; and
   a pair of flanking support members coupled to the cross member and flanking the support structure.

2. The mounting clip of claim 1, wherein the recess is sized to enable the printed circuit board to expand within the recess.

3. The mounting clip of claim 1, wherein the upper portion of the support structure tapers from adjacent the recess to a distal edge of the support structure.

4. The mounting clip of claim 1, wherein the upper portion comprises an inclined face configured to enable the printed circuit board to be moved from above the mounting clip into the recess, wherein the inclined face is located on a same side of support structure as the recess.

5. The mounting clip of claim 1, wherein the upper portion is located on a first side of the support structure and the upper portion is configured to flex in a direction toward a second side of the support structure opposite the first side to enable the printed circuit board to be moved from above the mounting clip into the recess.

6. The mounting clip of claim 1, wherein each flanking support member of the pair of flanking support members comprises a first longitudinal length, the support structure comprises a second longitudinal length, and first longitudinal length is greater than the second longitudinal length.

7. The mounting clip of claim 1, comprising a pair of foot members, wherein a respective foot member of the pair of foot members is disposed adjacent a lower portion of a respective flanking support member of the pair of flanking support members.

8. The mounting clip of claim 7, wherein each foot member of the pair of foot members comprises a top surface located beneath the recess.

9. The mounting clip of claim 7, wherein the pair of foot members contact the pair of flanking support members.

10. The mounting clip of claim 7, wherein the pair of foot members are spaced apart from the pair of flanking support members.

* * * * *